(12) United States Patent
Han et al.

(10) Patent No.: US 10,903,011 B2
(45) Date of Patent: Jan. 26, 2021

(54) MULTILAYER ELECTRONIC COMPONENT AND METHOD OF MANUFACTURING THE SAME

(71) Applicant: SAMSUNG ELECTRO-MECHANICS CO., LTD., Suwon-Si (KR)

(72) Inventors: Seung Hun Han, Suwon-Si (KR); Sung Min Cho, Suwon-Si (KR); Dong Joon Oh, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/050,480

(22) Filed: Jul. 31, 2018

(65) Prior Publication Data

US 2019/0103225 A1   Apr. 4, 2019

(30) Foreign Application Priority Data

Sep. 29, 2017  (KR) .................... 10-2017-0128096
Feb. 27, 2018  (KR) .................... 10-2018-0023564

(51) Int. Cl.
*H01G 4/008*   (2006.01)
*H01G 4/30*    (2006.01)
(Continued)

(52) U.S. Cl.
CPC .......... *H01G 4/30* (2013.01); *C23C 16/45525* (2013.01); *H01G 4/008* (2013.01);
(Continued)

(58) Field of Classification Search
CPC .......... H01G 4/30; H01G 4/228; H01G 4/232; H01G 4/248; H01G 4/008; C23C 16/45525
(Continued)

(56) References Cited

U.S. PATENT DOCUMENTS

2011/0266040 A1 * 11/2011 Kim ................... H01G 4/005
174/260
2014/0111300 A1    4/2014 Park
(Continued)

FOREIGN PATENT DOCUMENTS

| CN | 1433035 A | 7/2003 |
|---|---|---|
| JP | 2001-230151 A | 8/2001 |

(Continued)

OTHER PUBLICATIONS

Office Action issued in corresponding Korean Application No. 10-2018-0023564, dated Mar. 21, 2019.
(Continued)

*Primary Examiner* — Arun Ramaswamy
(74) *Attorney, Agent, or Firm* — Morgan, Lewis & Bockius LLP

(57) ABSTRACT

A multilayer electronic component includes: a capacitor body including first and second internal electrodes disposed to be alternately exposed through opposite surfaces, respectively, with respective dielectric layers interposed therebetween; first and second thin film layers including at least one of titanium nitride (TiN), ruthenium (Ru), platinum (Pt), iridium (Ir), or titanium (Ti), disposed on the surfaces of the capacitor body, and connected to the first and second internal electrodes, respectively; and first and second external electrodes formed on the first and second thin film layers. A thickness of the first or second thin film layer is less than or equal to 60 nm.

13 Claims, 7 Drawing Sheets

(51) Int. Cl.
  *H01G 4/232* (2006.01)
  *H01G 4/248* (2006.01)
  *C23C 16/455* (2006.01)

(52) U.S. Cl.
  CPC .......... *H01G 4/232* (2013.01); *H01G 4/2325* (2013.01); *H01G 4/248* (2013.01)

(58) Field of Classification Search
  USPC ......... 361/321.1, 301.4, 306.1, 306.3, 321.2, 361/321.3; 29/25.42
  See application file for complete search history.

(56) References Cited

U.S. PATENT DOCUMENTS

| | | |
|---|---|---|
| 2015/0380161 A1 | 12/2015 | Lim et al. |
| 2016/0027561 A1 | 1/2016 | Inoue et al. |
| 2016/0254094 A1 | 9/2016 | Lee et al. |

FOREIGN PATENT DOCUMENTS

| | | |
|---|---|---|
| JP | 2002-270458 A | 9/2002 |
| JP | 2014-086715 A | 5/2014 |
| KR | 10-2016-0001026 A | 1/2016 |
| KR | 10-2016-0013815 A | 2/2016 |
| KR | 10-2016-0104333 A | 9/2016 |

OTHER PUBLICATIONS

Notice of Decision for Rejection dated Feb. 17, 2020 in Korean Patent Application No. 10-2019-0057617 (with English Translation).

First Office Action dated May 29, 2020 in Chinese Patent Application No. 201811120412.3 (with English translation).

* cited by examiner

MULTILAYER ELECTRONIC COMPONENT AND METHOD OF MANUFACTURING THE SAME

CROSS-REFERENCE TO RELATED APPLICATION(S)

This application claims the benefit of priority to Korean Patent Application Nos. 10-2017-0128096 filed on Sep. 29, 2017 and 10-2018-0023564 filed on Feb. 27, 2018 in the Korean Intellectual Property Office, the disclosure of which is incorporated herein by reference in its entirety.

BACKGROUND

1. Field

The present disclosure relates to a multilayer electronic component and a method of manufacturing the same.

2. Description of Related Art

In accordance with the current trend towards lighter, thinner, more compact, and smaller electronic devices, various electronic components have become lighter, thinner, more compact, and smaller, and such trends have been applied to a multilayer capacitor (multilayer ceramic capacitor (MLCC)).

To maintain high capacity of a multilayer electronic component having a smaller size, there is a need to increase an effective volume ratio of an available volume to a volume of an entire capacitor body of a ceramic used as a dielectric substance.

As a method of increasing the effective volume ratio, a technology for gradually thinning internal and external electrodes has been developed.

However, there is a limit in embodying an electrode with a predetermined thickness or less using a method of forming an electrode of a typical multilayer capacitor.

In addition, there is a problem in terms of degraded performance or reliability along with thinning in an existing method and, thus, there has been an increasing need for a new method for resolving such problems.

SUMMARY

An aspect of the present disclosure may provide a multilayer electronic component and a method of manufacturing the same, for enhancing damp-proof reliability.

According to an exemplary embodiment in the present disclosure, a multilayer electronic component may include a capacitor body including first and second surfaces facing each other, third and fourth surfaces connected to the first and second surfaces and facing each other, and fifth and sixth surfaces connected to the first and second surfaces, connected to the third and fourth surfaces, and facing each other, and including first and second internal electrodes disposed to be alternately exposed through the third and fourth surfaces, respectively, with respective dielectric layers interposed therebetween, first and second thin film layers including at least one of titanium nitride (TiN), ruthenium (Ru), platinum (Pt), iridium (Ir), or titanium (Ti), disposed on the third and fourth surfaces of the capacitor body, and connected to the first and second internal electrodes, respectively, and first and second external electrodes formed on the first and second thin film layers. A thickness of the first or second thin film layer is less than or equal to 60 nm.

A deviation of the first or second thin film layer may be less than or equal to 10%.

A thickness ratio of a corner to a center of the first or second thin film layer may be 0.9 or more.

The first and second external electrodes may include copper.

The first and second external electrodes may have a multilayer structure including a copper layer, a nickel layer, and a tin layer.

The first and second external electrodes may have a double-layered structure including a nickel layer and a tin layer.

The first thin film layer may extend to a portion of the first, second, fifth, and sixth surfaces from the third surface of the capacitor body, and the second thin film layer may extend to a portion of the first, second, fifth, and sixth surfaces from the fourth surface of the capacitor body.

According to another exemplary embodiment in the present disclosure, a method of manufacturing a multilayer electronic component may include coating a material including at least one of titanium nitride (TiN), ruthenium (Ru), platinum (Pt), iridium (Ir), or titanium (Ti) using a thin film atomic layer deposition (ALD) process on an outer surface of a capacitor body to form a seed layer and sintering the seed layer, forming a conductive layer on a surface of the seed layer using a plating process, forming a polymer layer to cover opposite end portions of the capacitor body in a length direction, etching a portion of the conductive layer, not covered by the polymer layer, to form first and second external electrodes that are spaced apart from each other, removing the seed layer formed on a portion of the cover body, not covered by the first and second external electrodes, to form first and second thin film layers, spaced apart from each other, and removing the polymer layer. A thickness of the first or second thin film layer is less than or equal to 60 nm.

A deviation of the first or second thin film layer may be less than or equal to 10%.

A thickness ratio of a corner to a center of the first or second thin film layer may be 0.9 or more.

The conductive layer may include copper.

The conductive layer may have a multilayer structure of a copper layer, a nickel layer, and a tin layer by plating copper, nickel, and tin in the stated order.

The conductive layer may have a double-layered structure of a nickel layer and a tin layer by plating nickel and tin in the stated order.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
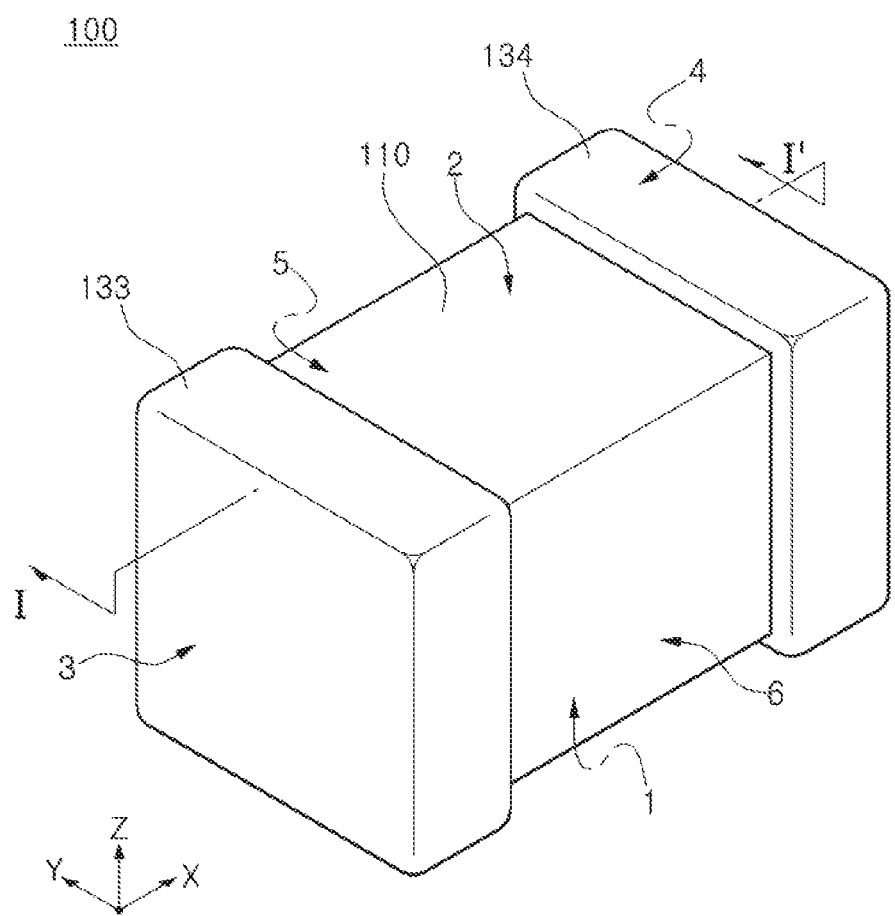
FIG. 1 is a perspective view of a multilayer electronic component according to an embodiment of the present disclosure.
Figure 2:
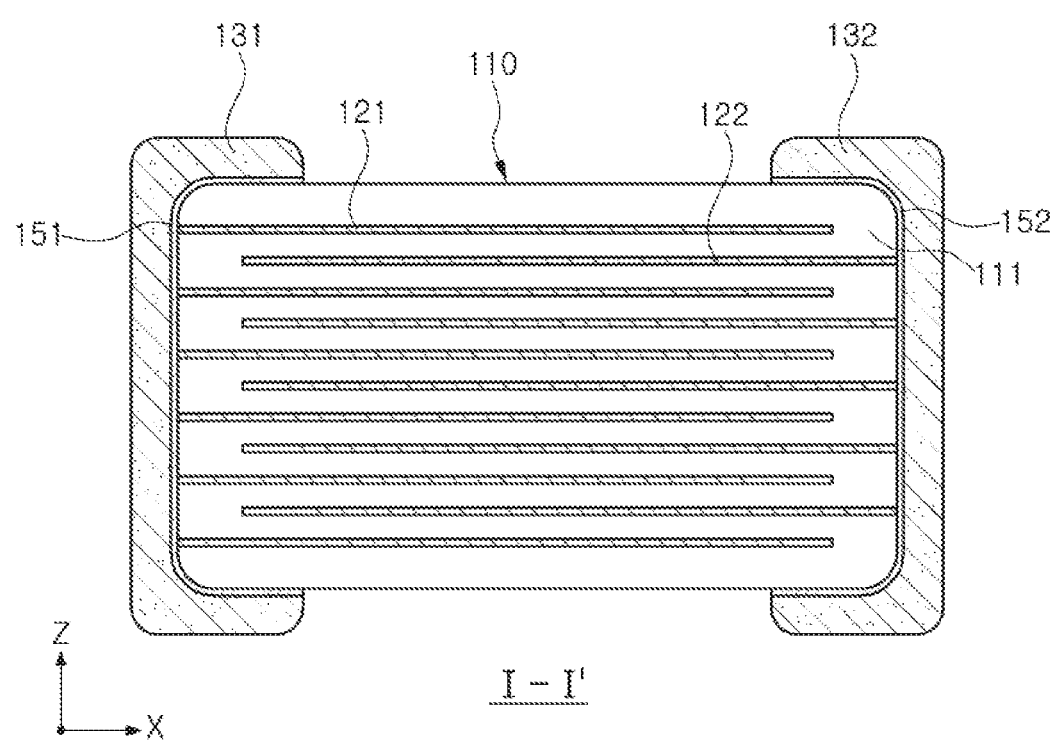
FIG. 2 is a cross-sectional view of line I-I' of FIG. 1.
Figure 3:
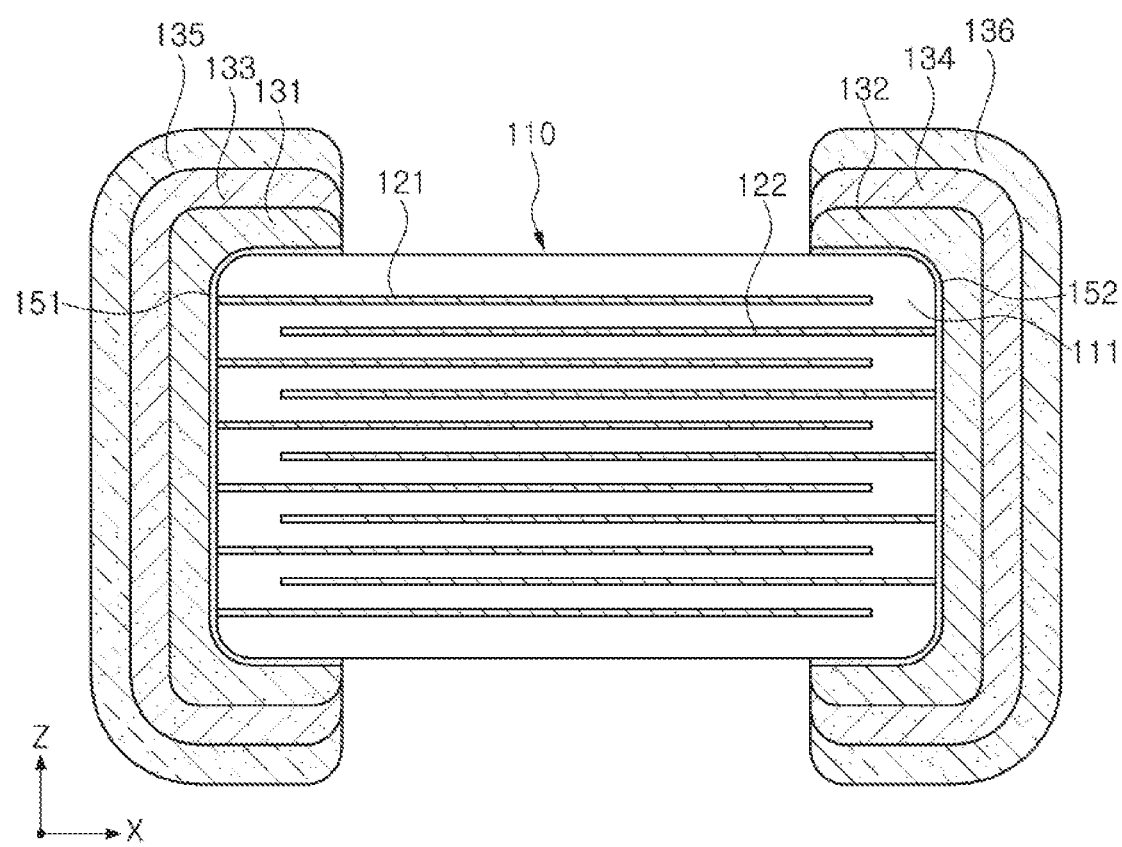
FIG. 3 is a cross-sectional view of the case in which a plating layer is additionally formed to FIG. 2.

FIG. 1 is a perspective view of a multilayer electronic component according to an embodiment of the present disclosure. FIG. 2 is a cross-sectional view of line I-I' of FIG. 1. FIG. 3 is a cross-sectional view of the case in which a plating layer is additionally formed to FIG. 2.

Referring to FIGS. 1 to 3, a multilayer electronic component according to an embodiment of the present disclosure may include a capacitor body 110, first and second thin film layers 151 and 152, and first and second external electrodes 131 and 132.

The capacitor body 110 may include a plurality of dielectric layers 111 and a plurality of first and second internal electrodes 121 and 122 that are alternately disposed across the plurality of dielectric layers 111.

The capacitor body 110 may include first and second surfaces 1 and 2 that face each other in the Z-axis direction, third and fourth surfaces 3 and 4 that are connected to the first and second surfaces 1 and 2 and face each other in the X-axis direction, and fifth and sixth surfaces 5 and 6 that are connected to the first and second surfaces 1 and 2, are connected to the third and fourth surfaces 3 and 4, and face each other in the Y-axis direction.

One end of the first and second internal electrodes 121 and 122 may be exposed through third and fourth surfaces 3 and 4 of the capacitor body 110, respectively.

The first and second thin film layers 151 and 152 may be disposed on the third and fourth surfaces 3 and 4 of the capacitor body 110, respectively, and may contact and may be electrically connected to the exposed portions of the first and second internal electrodes 121 and 122, respectively.

The first and second thin film layers 151 and 152 may include at least one of titanium nitride (TiN), ruthenium (Ru), platinum (Pt), iridium (Ir), or titanium (Ti).

In this case, the first and second thin film layers 151 and 152 may each have a thickness equal to or less than 60 nm. When the thickness of each of the first and second thin film layers 151 and 152 is greater than 60 nm, unnecessary process time may be increased and a plating failure rate may be increased.

A deviation in the first and second thin film layers 151 and 152 may be equal to or less than 10%. Here, the deviation may refer to a difference between maximum and minimum thickness values of the first or second thin film layers 151 or 152.

The first and second thin film layers 151 and 152 may have 0.9 or more as a thickness ratio of a corner to a center.

The first thin film layer 151 may extend to a portion of the first, second, fifth, and sixth surfaces 1, 2, 5, and 6 from the third surface 3 of the capacitor body 110. The second thin film layer 152 may extend to a portion of the first, second, fifth, and sixth surfaces 1, 2, 5, and 6 from the fourth surface 4 of the capacitor body 110.

The first and second external electrodes 131 and 132 may be formed on the first and second thin film layers 151 and 152.

The first and second external electrodes 131 and 132 may be disposed on the third and fourth surfaces 3 and 4 of the capacitor body 110, respectively, and may contact and may be electrically connected to the exposed portions of the first and second internal electrodes 121 and 122.

In this case, the first and second external electrodes 131 and 132 may extend to a portion of the first and second surfaces 1 and 2 of the capacitor body 110 and a portion of the fifth and sixth surfaces 5 and 6, respectively.

The first and second external electrodes 131 and 132 may be configured as a plating layer, for example, a copper layer including copper.

According to an embodiment of the present disclosure, the first and second external electrodes may be configured as a multilayer structure including copper layers 131 and 132, nickel layers 133 and 134 formed on the copper layers 131 and 132, and tin layers 135 and 136 formed on the nickel layers 133 and 134.

According to another embodiment of the present disclosure, the first and second external electrodes may be configured as a double-layered structure including a nickel layer and a tin layer, and a copper layer may be omitted therefrom.

Table 1 below shows a change in damp-proof reliability depending on a maximum thickness of a thin film layer in a comparative example in which the thin film layer is formed using a sputtering method and an embodiment in which the thin film is formed using an atomic layer deposition (ALD) method. Here, the thin film layer may be formed of a material of TiN. The damp-proof reliability refers to % of the number of samples in which reliability failure does not occur from 100 samples as a reliability test result. The reliability test was performed by applying a voltage of 9.5 V for 20 hours in a condition of 85° C. and 85%.

TABLE 1

| Thickness of thin film layer (nm) | Comparative Example (%) | Embodiment (%) |
| --- | --- | --- |
| 10 | 48 | 100 |
| 20 | 48 | 100 |
| 30 | 55 | 100 |
| 40 | 59 | 100 |
| 50 | 78 | 100 |
| 60 | 97 | 100 |
| 70 | 100 | 100 |
| 80 | 100 | 100 |
| 90 | 100 | 100 |
| 100 | 100 | 100 |

As seen from Table 1 above, in the case of samples in which a thickness of the thin film layer formed via sputtering is equal to or less than 60 nm, damp-proof reliability is equal to or less than 97% and there is a problem in terms of damp-proof reliability.

On the other hand, in the case of the thin film layer formed via ALD according to the embodiment, even if a thickness of the thin film layer is equal to or less than 60 nm, damp-proof reliability is 100% and excellent waterproof performance through a water penetrating path may be achieved even in a small thickness.

Accordingly, according to the present disclosure, a maximum thickness of the thin film layer may be equal to or less than 60 nm.

Hereinafter, a process of manufacturing a multilayer electronic component according to the present embodiment is described.

Figure 4:
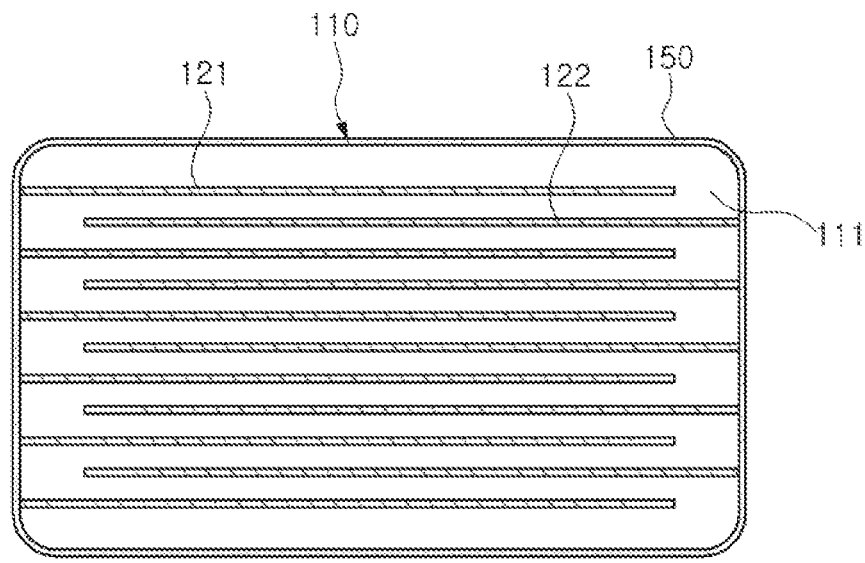
FIG. 4 is a cross-sectional view of a capacitor body including a thin film layer formed as a seed layer in a multilayer electronic component according to an embodiment of the present disclosure.
Figure 4:
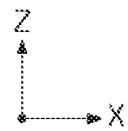

First, referring to FIG. 4, a predetermined material is coated and dried on an outer surface of the capacitor body 110 including the dielectric layer 111 and the first and second internal electrodes 121 and 122 using a thin film atomic layer deposition (ALD) method to form and sinter a seed layer 150.

In this case, an ALD method with conformality of 1:0.9 or more may be used and, thus, the overall thickness of the seed layer 150 may be uniformly and thinly adjusted. Accordingly, it may be possible to fill a very small gap with a thin film via coating.

A thickness of the seed layer 150 may be equal to or less than 600 nm and a deviation thereof may be 10% or less through an ALD method. The seed layer 150 may have a very uniform ratio of corner/center equal to or greater than 0.9.

The seed layer 150 may be formed of a material including at least one of TiN, Ru, Pt, Ir, or Ti.

The seed layer 150 may function as a seed for forming a conductive layer that is to be described below and may be densely formed to effectively block a water penetrating path, thereby enhancing the damp-proof reliability of a multilayer electronic component.

Figure 5:
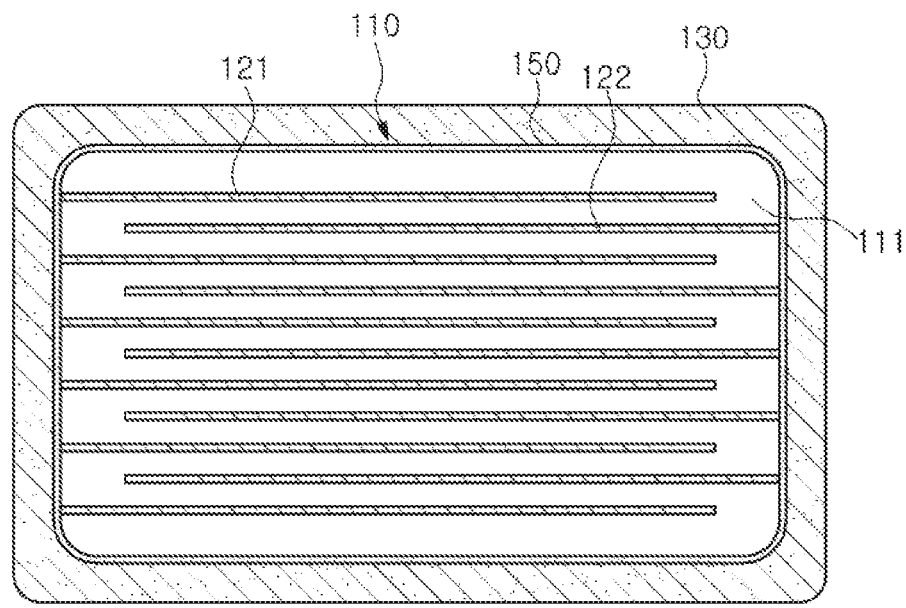
FIG. 5 is a cross-sectional view of the case in which a conductive layer is additionally formed to FIG. 4.
Figure 5:
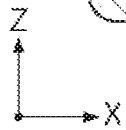

Then, as shown in FIG. 5, a conductive layer 130 may be formed on a surface of the seed layer 150 via a plating process.

The conductive layer 130 may be formed of copper or may be configured as a multilayer structure of a copper layer, a nickel layer, and a tin layer by plating copper, nickel, and tin in the stated order.

As another example, the conductive layer may be configured as a double-layered structure of a nickel layer and a tin layer by plating nickel and tin in the stated order.

Figure 6:
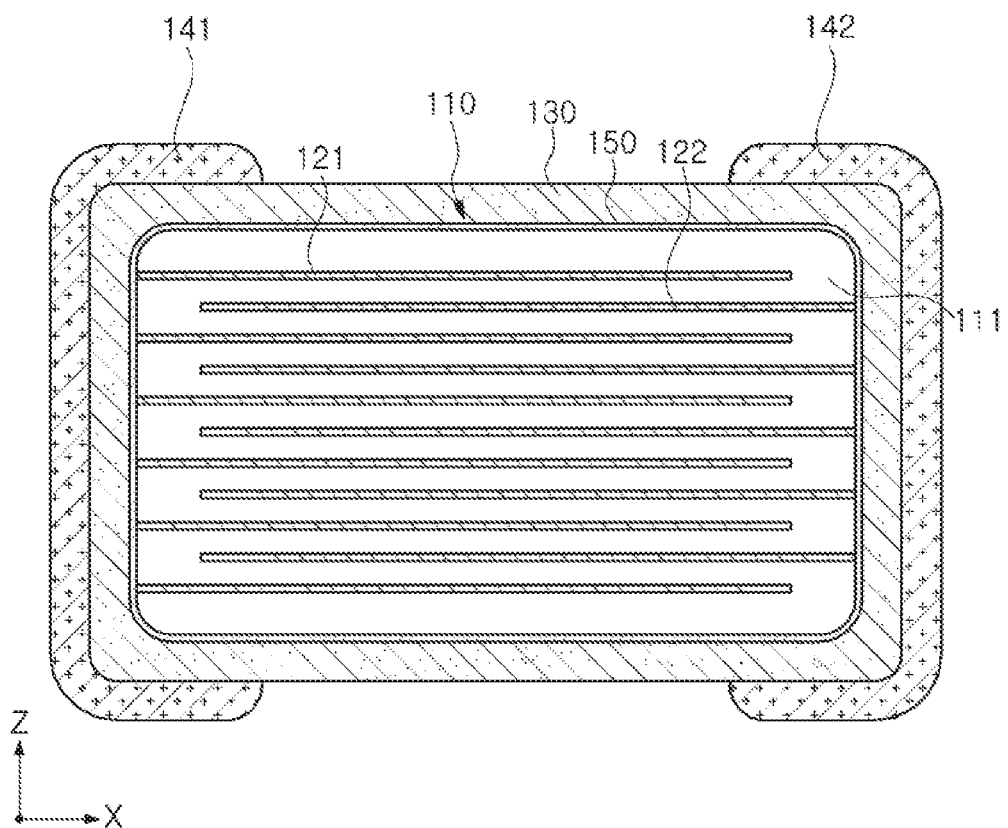
FIG. 6 is a cross-sectional view of the case in which a polymer layer is additionally formed to FIG. 5.

Then, as shown in FIG. 6, polymer layers 141 and 142 formed of a material such as epoxy may be formed to cover opposite end portions of the capacitor body 110 in the X-axis direction. The polymer layers 141 and 142 may function as an anti-etching layer during etching that is to be described below.

Figure 7:
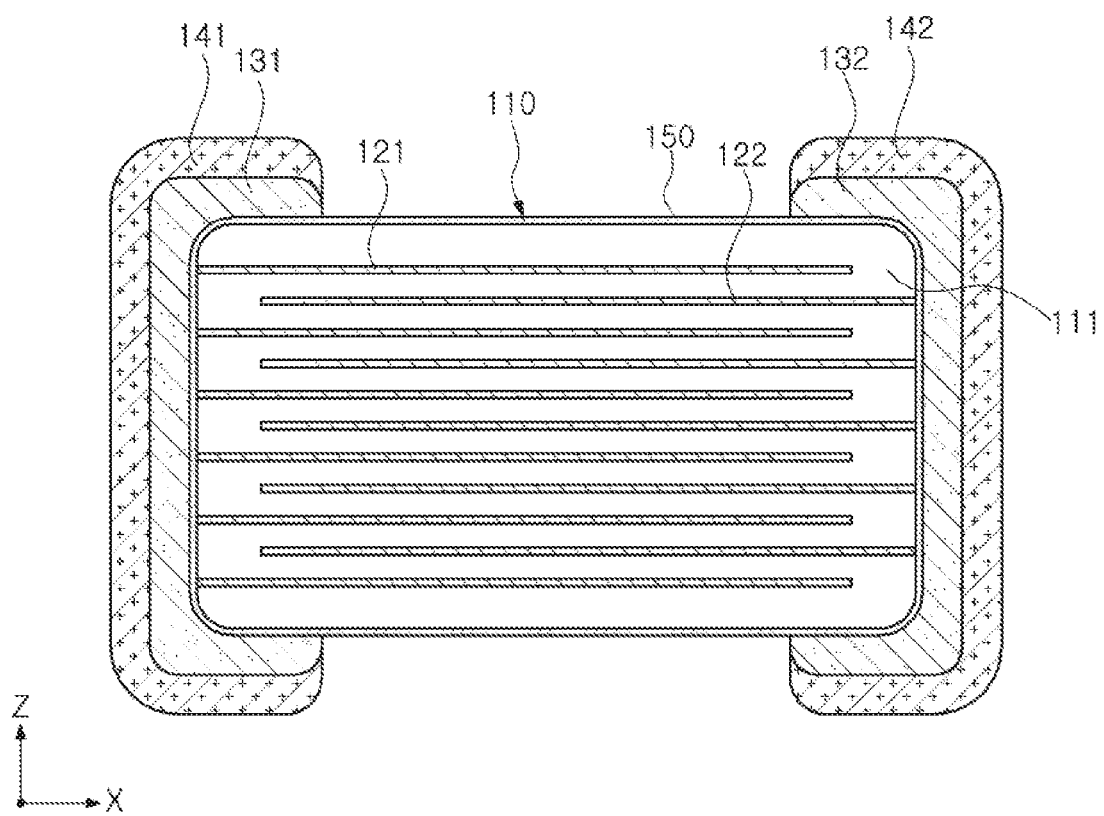
FIG. 7 is a cross-sectional view of the case in which a portion of a conductive layer is removed from FIG. 6 to provide first and second external electrodes.

Then, as shown in FIG. 7, a portion of the conductive layer 130, not covered by the polymer layers 141 and 142, may be etched and the first and second external electrodes 131 and 132 may be formed to be spaced apart from each other in the X-axis direction.

Figure 8:
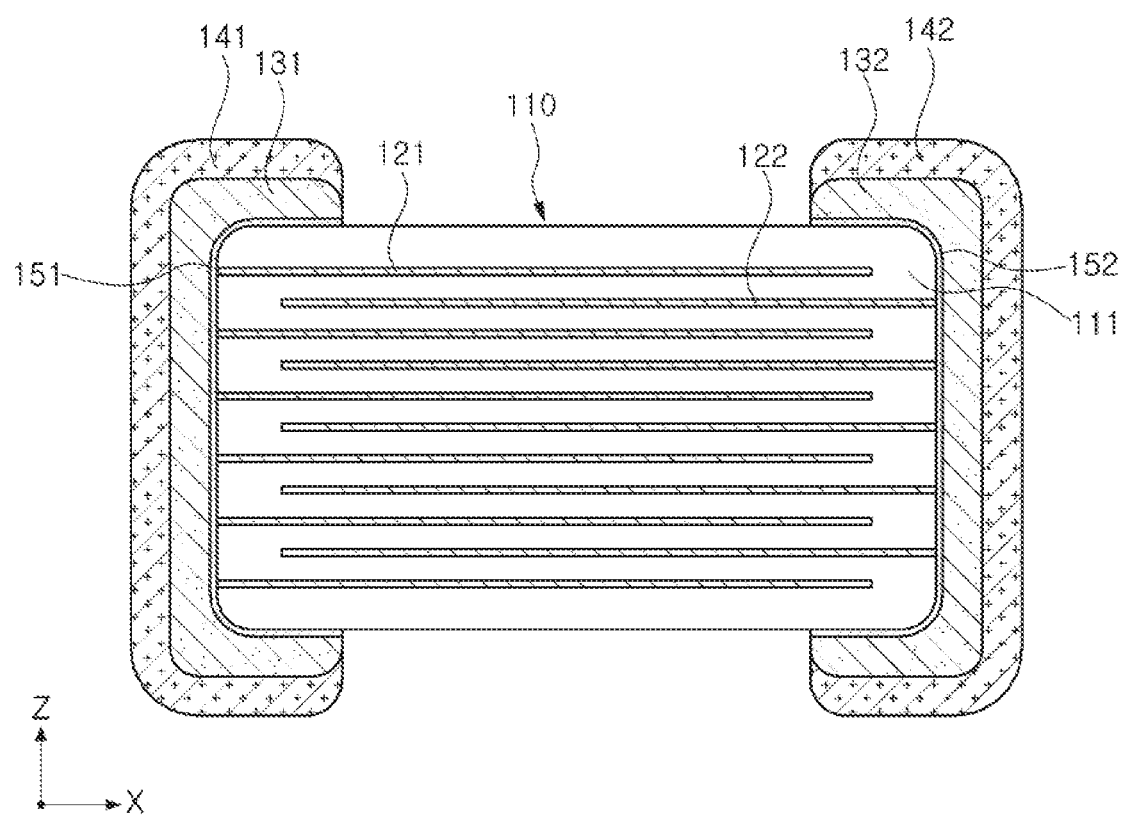
FIG. 8 is a cross-sectional view of the case in which a portion of a thin film layer is removed from FIG. 7.

Then, as shown in FIG. 8, the seed layer 150 formed on a portion of the capacitor body 110, not covered by the first and second external electrodes 131 and 132, may be removed via SiC grinding or the like and the first and second thin film layers 151 and 152 may be disposed to be spaced apart from each other in the X-axis direction on a surface of the capacitor body 110.

In this case, the first and second thin film layers 151 and 152 may be disposed between the surface of the capacitor body 110 and the first and second external electrodes 131 and 132.

In this case, the first and second thin film layers 151 and 152 may each have a thickness equal to or less than 60 nm and a deviation of each of the first and second thin film layers 151 and 152 may be equal to or less than 10%.

The first and second thin film layers 151 and 152 may have 0.9 or more as a thickness ratio of a corner to a center.

Then, the polymer layers 141 and 142 may be removed to complete a multilayer electronic component 100 shown in FIG. 2.

In a typical multilayer capacitor, a plating solution may penetrate through a portion of an external electrode, density of which is lowered, to damage an internal electrode and to cause reliability failure during a plating process of a manufacturing method.

When birdcaging between a capacitor body and an external electrode occurs during a process, the corresponding portion may act as a water penetrating path to degrade damp-proof reliability.

Accordingly, to enhance damp-proof reliability, a method of forming an organic layer on an end of an external electrode using an impregnation-coating method is disclosed and, in this case, a material such as polydimethylsiloxane (PDMS) may be used.

In such an impregnation method, when birdcaging occurs on a boundary surface between a capacitor body and an external electrode, some gaps may be filled, but when a gap is thin, it is difficult to allow a material to penetrate into the gap and, thus, there may be a problem in that a pore accumulates in the external electrode.

However, according to the present embodiment, after an external electrode is sintered, a multilayer thin film layer may be coated on a front surface of a multilayer electronic component using a thin film atomic layer deposition (ALD) process, thereby enhancing damp-proof reliability.

When birdcaging occurs on a boundary surface between a capacitor body and an external electrode, even if a gap is thin, a material is capable of penetrating into a portion by a depth, thereby preventing a pore from accumulating in the external electrode.

The multilayer electronic component manufactured as such may be used in bypassing, interstage coupling, filter, or the like of an IT device.

In a typical external electrode coating technology, a liquid paste is dipped in up and down directions and, then, is dried and, thus, there is a limit in uniformly forming an electrode while lowering a height thereof.

In the case of dipping, there is a technological limit in enhancing an effective volume ratio of a multilayer capacitor to enhance capacity, and a coating shape of an external electrode has a convex central portion and a thin corner portion.

For example, the central portion of the external electrode may have a thickness of about 20 μm but the corner portion of the external electrode may have a thickness of about 1.5 μm and, thus, a corner/center ratio may be around 0.07.

Accordingly, radial crack may occur in an electrode with a low height during an electrode heat treatment process and acts as a water penetrating path, thereby degrading reliability. In addition, the external electrode with a low thickness at the corner portion, may have an increased risk of a penetrating path of a plating solution and water, thereby causing failure.

In a conventional thin film external electrode forming method, a chip including an external electrode formed only a band portion and a WT surface may be manufactured by depositing a multilayer ceramic capacitor (MLCC) sintering chip on a front surface through a sputtering process to form a metallic thin film, forming an anti-etching layer with a polymer material such as epoxy in a portion, in which the band portion is to be formed, and etching a metallic thin film formed in a central portion of the chip to remove a polymer layer.

The external electrode formed using the sputtering method may have a uniform small thickness (>2 μm) and a corner/center ratio may be increased to a level of 0.7 to 1.0, thereby enhancing uniformity of the electrode of the corner portion by a predetermined degree.

However, when a sputtering method is used, there is a limit in uniformly coating an entire chip using a single process due to a shadowing effect.

However, according to the present embodiment, when a typical sputtering process is used, an operation of sputtering a seed layer twice may be replaced with one ALD process, thereby reducing the number of all processes.

The external electrode is formed using a plating process without being sintered and, thus, electrical connectivity with an internal electrode with respect to an external electrode formed using a conductive paste (e.g., copper paste) including impurities such as a typical dispersant may be enhanced.

Electrical connectivity with the internal electrode may be enhanced due to high step coverage compared with a typical sputtering process.

A seed layer formed using an ALD method may have at least 0.9 or more as a very uniform corner/center ratio and may be formed as a dense layer even in a small thickness, thereby remarkably enhancing damp-proof reliability. Here, the center is a value of a thickness of a thickest portion of a connection portion of the external electrode and the corner is a value of a thickness of a corner portion of the external electrode, i.e., a connected portion between the connection portion and the band portion.

For example, when the thin film layer is formed via dipping, an average corner/center ratio may be about 0.07, when the thin film layer is formed via sputtering, the corner/center ratio may be 0.7, and when the thin film layer is formed via ALD in the present disclosure, the corner/center ratio may be even closer to 1.0. That is, according to the present disclosure, the corner may be effectively covered even with a small thickness. In this case, the average values may be calculated by calculating 20 or more of products manufactured for the respective processes.

The multilayer electronic component manufactured as such may be used in bypassing, interstage coupling, filtering, or the like of an IT device.

As set forth above, according to an exemplary embodiment in the present disclosure, the damp-proof reliability and electrical connectivity of a multilayer electronic component may be enhanced.

While exemplary embodiments have been shown and described above, it will be apparent to those skilled in the art that modifications and variations could be made without departing from the scope of the present disclosure as defined by the appended claims.

What is claimed is:

1. A multilayer electronic component comprising:
a capacitor body including first and second surfaces facing each other, third and fourth surfaces connected to the first and second surfaces and facing each other, and fifth and sixth surfaces connected to the first and second surfaces, connected to the third and fourth surfaces, and facing each other, and including first and second internal electrodes disposed to be alternately exposed through the third and fourth surfaces, respectively, with respective dielectric layers interposed therebetween;
first and second thin film layers including at least one of titanium nitride (TiN), ruthenium (Ru), platinum (Pt), iridium (Ir), or titanium (Ti), disposed on the third and fourth surfaces of the capacitor body, and connected to the first and second internal electrodes, respectively; and
first and second external electrodes formed on the first and second thin film layers, respectively,
wherein a thickness of the first or second thin film layer is less than or equal to 60 nm, and
wherein the first and second thin film layers are disposed on the third and fourth surfaces of the capacitor body, respectively, using an atomic layer deposition (ALD) method.

2. The multilayer electronic component of claim 1, wherein a deviation of the first or second thin film layer is less than or equal to 10%.

3. The multilayer electronic component of claim 1, wherein a thickness ratio of a corner to a center of the first or second thin film layer is 0.9 or more.

4. The multilayer electronic component of claim 1, wherein the first and second external electrodes include copper.

5. The multilayer electronic component of claim 1, wherein the first and second external electrodes have a multilayer structure including a copper layer, a nickel layer, and a tin layer.

6. The multilayer electronic component of claim 1, wherein the first and second external electrodes have a double-layered structure including a nickel layer and a tin layer.

7. The multilayer electronic component of claim 1, wherein the first thin film layer extends to a portion of the first, second, fifth, and sixth surfaces from the third surface of the capacitor body; and
wherein the second thin film layer extends to a portion of the first, second, fifth, and sixth surfaces from the fourth surface of the capacitor body.

8. A method of manufacturing a multilayer electronic component, the method comprising:
coating a material including at least one of titanium nitride (TiN), ruthenium (Ru), platinum (Pt), iridium (Ir), or titanium (Ti) using a thin film atomic layer deposition (ALD) process on an outer surface of a capacitor body to form a seed layer and sintering the seed layer;
forming a conductive layer on a surface of the seed layer using a plating process;
forming a polymer layer to cover opposite end portions of the capacitor body in a length direction;
etching a portion of the conductive layer, not covered by the polymer layer, to form first and second external electrodes that are spaced apart from each other;
removing the seed layer formed on a portion of the capacitor body, not covered by the first and second external electrodes, to form first and second thin film layers, spaced apart from each other; and
removing the polymer layer,
wherein a thickness of the first or second thin film layer is less than or equal to 60 nm.

9. The method of claim 8, wherein a deviation of the first or second thin film layer is less than or equal to 10%.

10. The method of claim 8, wherein a thickness ratio of a corner to a center of the first or second thin film layer is 0.9 or more.

11. The method of claim 8, wherein the conductive layer includes copper.

12. The method of claim 8, wherein the conductive layer has a multilayer structure including a copper layer, a nickel layer, and a tin layer by plating copper, nickel, and tin in the stated order.

13. The method of claim 8, wherein the conductive layer has a double-layered structure including a nickel layer and a tin layer by plating nickel and tin in the stated order.

* * * * *